United States Patent
Protic et al.

(10) Patent No.: US 7,915,592 B2
(45) Date of Patent: Mar. 29, 2011

(54) DUAL-SIDED MICROSTRUCTURED, POSITION-SENSITIVE DETECTOR

(75) Inventors: Davor Protic, Jülich (DE); Thomas Krings, Linnich (DE); Ralf Schleichert, Kerpen (DE)

(73) Assignee: Forschungszentrum Julich GmbH, Julich (DE)

( * ) Notice: Subject to any disclaimer, the term of this patent is extended or adjusted under 35 U.S.C. 154(b) by 165 days.

(21) Appl. No.: 11/639,479

(22) Filed: Dec. 15, 2006

(65) Prior Publication Data

US 2007/0152288 A1 Jul. 5, 2007

Related U.S. Application Data

(63) Continuation of application No. 10/481,091, filed on Dec. 12, 2003, now Pat. No. 7,242,006.

(30) Foreign Application Priority Data

Jun. 15, 2001 (DE) .................................. 101 28 654

(51) Int. Cl.
*G01T 1/24* (2006.01)
(52) U.S. Cl. ................................. 250/370.01
(58) Field of Classification Search ............ 250/370.01, 250/370; 257/428, 429, 43, 44, 45, 460, 257/461, 462, 463, 464, 465, 466
See application file for complete search history.

(56) References Cited

U.S. PATENT DOCUMENTS

| | | | |
|---|---|---|---|
| 3,691,389 A | 9/1972 | Ellis et al. | |
| 3,925,669 A | 12/1975 | Glasow | |
| 4,055,765 A * | 10/1977 | Gerber et al. | 250/370.09 |
| 4,292,645 A * | 9/1981 | Schlosser et al. | 257/430 |
| 4,411,059 A * | 10/1983 | Schlosser et al. | 438/73 |
| 4,785,186 A | 11/1988 | Street et al. | |
| 5,164,809 A | 11/1992 | Street et al. | |
| 5,986,278 A | 11/1999 | Becker et al. | |
| 6,169,287 B1 | 1/2001 | Warburton | |
| 7,060,523 B2 * | 6/2006 | Tindall et al. | 438/57 |
| 2005/0001279 A1 * | 1/2005 | Protic et al. | 257/435 |

OTHER PUBLICATIONS

Protic, D. et. al., Development of Double Sided Microstructured SI(LI) Detectors, Aug. 2002, IEEE Transactions on Nuclear Science, vol. 49, No. 4, pp. 1993-1998.*
F. Shopper et al, Development of Silicon Strip Detectors . . . , 1EEE Nuclear Science Symposium, Oct. 2000, pp. 3:122-3:126.
D. Protic et al, A Micro-Strip Germanium Detector . . . , 1EEE Nuclear Science Symposium, Oct. 2000, pp. 4:111-4:114.
J.T. Walton et al, Si (Li) X-Ray Detector . . . , 1EEE Transactions on Nuclear Science, vol. NS-31, No. 1, Feb. 1984 pp. 331-335.
P. Holl et al, A Double-Sided Silicon Strip Detector . . . , IEEE Transactions on Nuclear Science, Feb. 1989, vol. 36, No. 1, pp. 251-255.

* cited by examiner

*Primary Examiner* — David P Porta
*Assistant Examiner* — David S Baker
(74) *Attorney, Agent, or Firm* — Ladas & Parry LLP

(57) ABSTRACT

The invention relates to a detector for determining the position and/or energy of photons and/or charged particles. Said detector comprises a plurality of diodes made of a semiconductor material, n-contacts (1) and p-contacts (4), the n-contacts being provided by dividing an n-layer into individual segments. Said segments of the n-layer are 20-500 μm wide. Said detectors are produced by diffusing ions on the side of the semi-conductor material in order to produce an n-contact. A metallic layer is metallized thereon. Trenches are etched between the segments by means of lithography for the segmentation thereof. The inventive detector is high-powered and inter alia enables a high local resolution and high counting rates.

9 Claims, 1 Drawing Sheet

DUAL-SIDED MICROSTRUCTURED, POSITION-SENSITIVE DETECTOR

The present application is a Continuation of U.S. patent application Ser. No. 10/481,090, filed Dec. 12, 2003, now U.S. Pat. No. 7,242,006.

The invention relates to a detector for determining the position and/or energy of photons and/or charged particles. Said detector is made of a semiconductor material such as silicon. A multiplicity of diodes is provided by means of the semiconductor material and by segmented n-contacts and p-contacts.

A detector of the above-mentioned type made of silicon is known from WO 97/33302. Such detectors operate in principle as follows. A charged particle or photons, such as for example X-ray quanta or gamma quanta (Y-quanta), impinge on the detector made of silicon. Because of the ensuing interaction between the charged particle and the silicon, or between the photon and the silicon, mobile electron-hole pairs which are not bound to the lattice atoms, i.e. mobile charge carriers, are produced in the silicon. The number of resulting electron-hole pairs is proportional to the energy emitted by the impinging charged particle or photon.

The detector includes diodes together with associated p-contacts and n-contacts and is under blocking voltage during use. The mobile charge carriers are collected on the p-contacts and n-contacts in the electrical field of the detector which is under blocking voltage. As this happens an electric current flows. The collected charge is a measure of the energy of the above-mentioned charged particle or photon.

SUMMARY OF THE INVENTION

The invention relates to detectors which have subdivided n-contacts and p-contacts. Said contacts are microstructured.

A relatively large n-contact or p-contact is therefore subdivided into a large number of elements in such a way that each element acts as an independent detector. Each element is connected to a charge-sensitive amplifier so that the elements can be read individually. The subdivision makes it possible to determine the position at which the charged particle or the photon has impinged on the detector. The finer the subdivision is, the better the local resolution.

An amplifier which is connected to a single element can operate effectively-only up to a maximum counting rate which is dependent on the apparatus. This limits the number of charged particles or photons which can be determined within a time unit. If a detector is subdivided into n elements each of which is connected to its own amplifier, n times the counting rate can be achieved. The finer the subdivision is, therefore, the higher the possible counting rates.

An Si (Li) detector is a relatively thick (2-10 mm) PIN diode made of silicon. The thin (<1 µm) p-contact is produced by boron implantation or vapour-deposition of gold. The thicker (10-500 µm) n-contact is produced by lithium diffusion. The i-zone, which is a few millimetres thick, is obtained in a drift process in which the lithium ions compensate the acceptors in the starting material.

Position-sensing silicon detectors up to thicknesses of approx. 1 mm and microstructured on both contacts are commercially obtainable. One-dimensional Si (Li) strip detectors with the above-mentioned subdivision or structure on the $p^+$-side and more than 2 mm thick are known. Furthermore, two-dimensional position sensing by means of such detectors using analogue methods (non-segmented) represents the state of the art. Dual-sided digital position-sensitive Si (Li) detectors with relatively coarse subdivision of the contacts (~2 mm) have been known since 1973 [NIM 112 (1973) 455].

Known Si (Li) detectors do not have microstructures on the Li-diffused contact. With the methods used hitherto, whereby segmentation or subdivision is effected by sawing or milling the 100 to 500 µm thick Li-contact, structures smaller than 1 mm cannot be produced. These detectors are therefore restricted to use with low particle rates and relatively low local resolution. In addition, they have only a small dynamic range in combined particle identification/energy measurement.

It is the object of the invention to provide a high-powered detector with diodes having p-contacts and n-contacts.

The object of the invention is achieved by a detector having the features of the main claim and by a method having the features of the independent claim. Advantageous embodiments are apparent from the dependent claims.

The claimed detector for determining charged particles or photons has a plurality of diodes with p-contacts and n-contacts. The p-contacts and n-contacts have been provided by subdividing a p-layer and an n-layer into individual segments. The segments of the n-layer are 20 to 1000 µm wide. In particular, they are only 500 µm wide.

In contrast to the prior art, substantially smaller segmentations in the more problematic n-layer have been successfully provided. Because of the smaller structures the above-mentioned improvements can be achieved, as compared to the state of the art. In principle, therefore, the detector according to the invention makes possible inter alia higher counting rates and improved local resolution in a measurement.

The detector is made in particular of silicon. The n-contact is preferably doped with lithium and was prepared, for example, by diffusing lithium into the silicon. In particular, the p-side also has comparatively small segmentations. These are preferably not wider than 1000 µm, in particular not wider than 500 µm.

In a further embodiment of the invention the n-layer is subdivided into segments which are not larger than 1000 µm (in particular 500 µm)×1000 µm. The achievable lower limit is approx. 20 µm×20 µm.

To achieve good local resolutions the segments on the p-side and the n-side are alternatively formed as strips. The strips on the p-side are disposed perpendicularly relative to the strips on n-side.

A corresponding segmentation is expedient for the p-layer.

For the n-contacts in particular, the segments are separated by trenches which are 10 to 50 µm, preferably 20 to 30 µm wide. This results from the manufacturing process according to the invention.

Charged particles with ranges of, for example, up to 10 mm in silicon can be identified with the detector according to the invention. If a particle is stopped in the detector it generates the largest number of charge carrier pairs at the end-point of its trajectory. From there the positive charges drift to one contact and the negative charge carriers to the other. The difference between the arrival times is a measure of the position at which the particles were stopped. The drift times and the corresponding informative difference are therefore ascertained. For example, if a particle is stopped directly at the surface of the detector, one type of charge carrier reaches its contact practically immediately while the other type must first drift to the other contact. In this way additional information on the penetration depth, or the length of the path the particle has traveled in the silicon, is obtained for stopped particles from the difference between the arrival times.

For charged particles the above-mentioned penetration depth depends on the energy of the particle. Plotting of the particle energy against its penetration depth yields a particular characteristic curve for each type of particle. An individual particle is identifiable by constructing these curves. Particles are therefore successfully identified by measuring the differences in drift times. A large dynamic range in comparison to the state of the art can be achieved with the detector according to the invention. The detector according to the invention therefore meets particularly well the demands placed on the detector in such a measurement.

The individual segments of the n-contacts of the detector can be read individually. This results in very good local resolution of, for example, better than 500 μm×100 μm. To achieve this, strip-shaped segments on the n-side are 500 μm wide. Strip-shaped segments on the p-side are then 100 μm wide. The strips on the p-side are disposed orthogonally in relation to the strips on the n-side. The maximum attainable local resolution is directly related to the width of the strip-shaped segments. Furthermore, the detector permits operation at high counting rates.

Rapid position sensing (typically 100 ns) for triggering purposes and for resolving ambiguities is possible with the detector according to the invention. Two or more particles impinging simultaneously can as a rule be detected without difficulty. Three-dimensional position sensing ($\Delta z$-100 μm) by individual drift time measurements per segment with time resolutions <10 ns FWHM is possible. Such three-dimensional position sensing is known as such, for example from the publication "Nuclear Instruments and Methods in Physics Research", Section A, 452 (2000) 155-166-"Three-dimensional position sensing and field shaping in orthogonal-strip germanium-ray detectors", M. Amman, P. N. Luke.

The segmentation of the $p^+$-implanted contact with structures smaller than 100 μm conforms to the state of the art, which is described, for example, in the publication "The Germanium Wall of the GEM Detector System", S. Igel, A. Hamacher, K. Kilian, H. Machner, D. Protic, R. V. Srikantiah, Acta Physika Polonika B, No. 2-3, Vol. 26 (1995).

The microstructures on the $n^+$-contact, which as a result of the Li diffusion is substantially thicker and therefore more problematic, are produced by the following techniques: 20-30 μm thick Li-diffused contacts are produced by Li diffusion. Details on the implementation of such a process for producing the $n^+$-contact can be found, for example, in the publication "Si (Li) X-ray Detectors with Amorphous Silicon Passivation", J. T. Walton, R. H. Pehl, Y. K. Wong, C. P. Cork, in IEEE Transactions on Nuclear Science, Vol. NS-31, No. 1, February 1984, pp. 331-335. This contains a description of a 10 μm thick contact doped with Li. The thickness can be changed in a specified manner by adjusting the relevant parameters. Parameters to be considered are, in particular, the manner in which the lithium is deposited on the silicon surface, the temperature set during diffusion and the duration. Once cooling has taken place the diffusion is ended in practice. With increasing temperatures and/or longer duration thicker contacts are produced. The desired thickness of the n-contact can also be set in a specified manner according to the invention by removal of a surface layer.

The individual detector segments are separated by trenches approx. 30 μm deep and approx. 30 μm wide. The trenches are defined photolithographically and are produced by plasma etching. The individual steps may be as follows: after the doping through implantation the doped layer is coated with an electrically conductive material by vapour deposition. Aluminium has proved advantageous as the electrically conductive material. A photosensitive resist is applied to the vapour-deposited layer. The desired structures are predefined by exposure through a mask. The photosensitive resist is developed. Through the access ways to the aluminium layer thus produced the aluminium is removed here and etching is then continued to the desired depth in the silicon material. The photosensitive resist is removed and the remaining aluminium segments are bonded electrically.

This technique allows structures smaller than 1000 μm to be produced without difficulty and is known in principle from the documents [NIM 226 (1984) 103-106], [NIM A 462/3 364 (2001)].

EXEMPLARY EMBODIMENT

Figure 1:
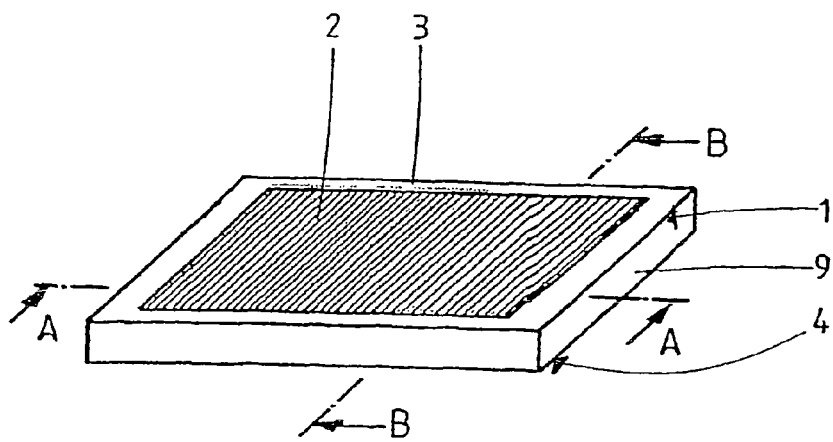
FIG. 1 is a perspective view of the detector according to the invention.
Figure 1A:
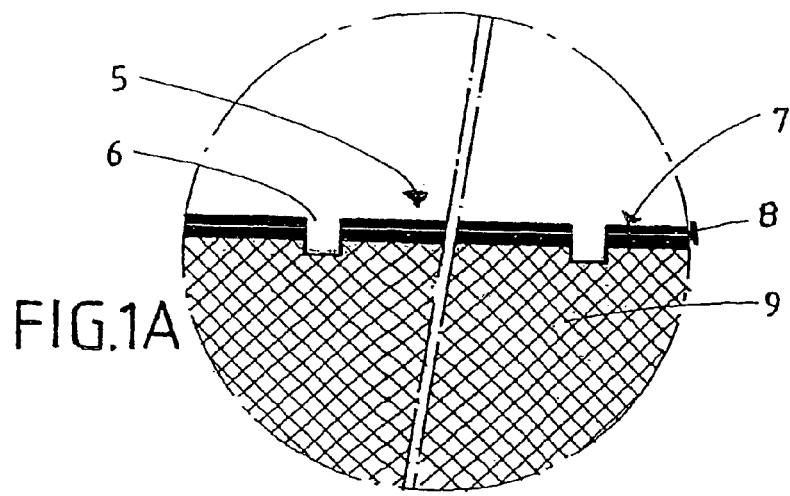
FIG. 1A is a cross section view of the detector taken along line A-A of FIG. 1.
Figure 1B:
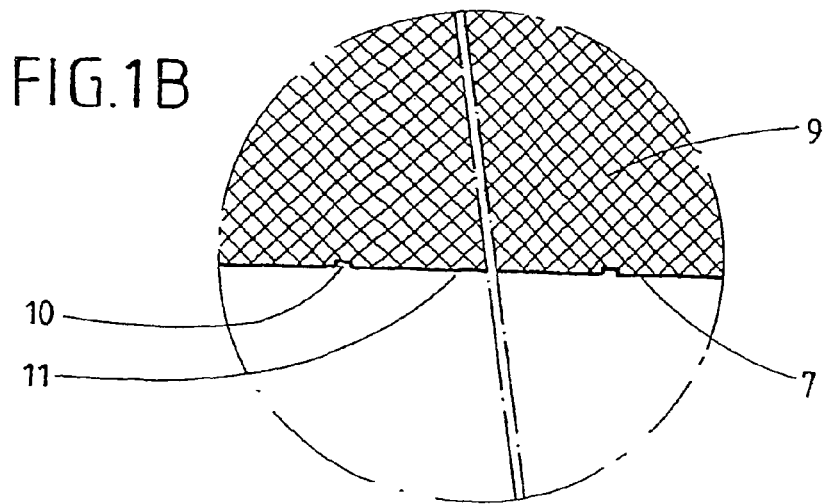
FIG. 1B is a cross section view of the detector taken along line B-B of FIG. 1.

A SI (Li) detector is a relatively thick (2-10 μm) PIN dioxide of silicon. The thin (<1 μm) p-contact is produced by boron implantation or vapour deposition with gold. The thicker (10-500 μm) n-contact is produced by lithium diffusion. The I-zone, a few millimeters thick, is obtained in a drift process in which the lithium ions compensate the acceptors in the starting material.

A Si (Li) diode measuring 60×60 mm$^2$ and 5 mm thick was produced in this way. Said diode is illustrated in the drawings. The thickness of the Li-diffused contact (1, 8) is 30 mm$^2$. A vapour-deposited aluminium layer (7), 0.3 μm thick, increases the conductivity of the Li-diffused layer.

The trenches (6, 10), or the position-sensitive structure, were defined by photolithography. In this case there are 50 strips (approx. 1 mm wide) on an area of 50×50 mm$^2$. After disintegration of the aluminium layer and subsequent deep plasma etching trenches approx. 40 μm deep and approx. 50 μm wide are produced. In this way the individual detector elements are separated by the trenches. This method makes it possible to produce position-sensitive structures of any desired shape. For example, spiral shapes for the segmentation are possible. The structuring of the $p^+$-side (4, 10, 11) is carried out in a similar way.

The reference numerals designate: 1: $n^+$-contact (produced by lithium diffusion); 2: structure (in this case 50 strips with a periodicity of 1 mm and a strip length of 50 mm); 3: guard ring of the lithium-diffused contact; 4: $p^+$-contact (produced by boron implantation) having the same structure as the $n^+$-contact (orthogonal to the structure of the $n^+$-contact); 5: detector element (in this case: strip 950 μm wide); 6: trench (in this case 50 μm wide and 40 μm deep); 7: aluminium layer; 8: contact prepared by lithium diffusion; 9: silicon compensated with lithium; 10: trench (in this case 20 μm wide and 5 μm deep); 11: detector element (in this case strip 980 μm wide).

The invention claimed is:

1. A detector for determining the position and/or energy of photons and/or charged particles, comprising a plurality of diodes made of a semiconductor material and n-contacts and p-contacts, the n-contacts being provided by subdividing an initially-formed n-layer having an initial thickness into individual n-contact forming segments, characterized in that the segments of the n-layer are at least 20 μm wide, the n-contacts are made by li-diffusion and have a thickness in the range of 10 to 30 μm, the thickness being achieved by removal of a surface layer of said initial thickness of the initially-formed n-layer after Li-diffusion.

2. Detector according to claim 1, wherein the semiconductor material is silicon.

3. Detector according to claim 1, wherein the n- and p-contact segments are strip-shaped, the p-contacts are not wider than 500 μm and are disposed orthogonally to the strip-shaped segments of the n-contacts.

4. Detector according to claim 1, wherein the n-contact segments are not larger than 1000 μm×1000 μm.

5. Detector according to claim 1, wherein the n-contact segments are separated from one another by trenches which are 10 to 50 μm wide.

6. Detector according to claim 1, wherein the n-contacts have a metallic layer vapor-deposited thereon.

7. Detector according to claim 1, wherein each n-contact is connected to an amplifier.

8. A detector for determining the position and/or energy of photons and/or charged particles, comprising a plurality of diodes made of a semiconductor material and n-contacts and p-contacts, the n-contacts being provided by subdividing an initially-formed n-layer having an initial thickness into individual n-contact forming segments, characterized in that the segments of the n-layer are at least 20 μm wide, the n-contacts are made by li-diffusion and have a thickness in the range of 10 to 30 μm, said detector being made by the process of diffusing Li ions in one side of the semi-conductor material to form an n-contact; forming a desired thickness of the diffused n-contact by the subsequent removal of a top layer of the initial thickness of said initially-formed n-layer; vapor-depositing a metal layer thereon; and etching trenches through the n-contact by means of lithography for segmentation.

9. Detector according to claim 8, wherein said diffusion of Li ions in one side of the semi-conductor material to form an n-contact is taken place at a temperature of approximately 300° F.

* * * * *